US005556464A

United States Patent [19]

Tanabe et al.

[11] Patent Number: 5,556,464

[45] Date of Patent: Sep. 17, 1996

[54] VIBRATION PLATE OF A SPEAKER AND METHOD FOR PRODUCING SAME

[75] Inventors: Keiichiro Tanabe; Naoji Fujimori, both of Hyogo, Japan

[73] Assignee: Sumitomo Electric Industries, Ltd., Osaka, Japan

[21] Appl. No.: 387,110

[22] Filed: Feb. 10, 1995

Related U.S. Application Data

[62] Division of Ser. No. 91,689, Jul. 15, 1993, Pat. No. 5,430, 204.

[30] Foreign Application Priority Data

Jul. 15, 1992 [JP] Japan .................................... 4-212253

[51] Int. Cl.[6] .................................................. C30B 29/04

[52] U.S. Cl. .......................... 117/106; 423/446; 117/929; 264/85

[58] Field of Search ............................ 423/446; 117/929, 117/106; 264/85

[56] References Cited

U.S. PATENT DOCUMENTS

| | | | |
|---|---|---|---|
| 4,725,345 | 2/1988 | Sakamoto et al. | 204/192.31 |
| 4,855,093 | 8/1989 | Yoshida | 264/29.6 |
| 4,975,318 | 12/1990 | Suda | 428/260 |
| 4,987,002 | 1/1991 | Sakamoto et al. | 427/34 |
| 5,043,185 | 8/1991 | Murakami et al. | 427/113 |
| 5,130,111 | 7/1992 | Pryor | 423/446 |
| 5,180,571 | 1/1993 | Hosoya et al. | 423/446 |
| 5,241,140 | 8/1993 | Itoh et al. | 181/189 |
| 5,273,731 | 12/1993 | Anthony et al. | 117/929 |

FOREIGN PATENT DOCUMENTS

| | | |
|---|---|---|
| 0341589 | 11/1989 | European Pat. Off. . |
| 0398257 | 11/1990 | European Pat. Off. . |
| 55-33237 | 8/1980 | Japan . |
| 61-128700 | 6/1986 | Japan . |
| 62-152299 | 7/1987 | Japan . |
| 1100277 | 4/1989 | Japan . |
| 423480 | 4/1992 | Japan . |
| 2236541 | 4/1991 | United Kingdom . |

OTHER PUBLICATIONS

Cermak, "Effect of Laser Radiation on the Diamond to Graphite Transformation in Polycrystalline (PK–Dia)", Pokroky Praskove Metal. (1987), vol. 2, pp. 60–66, abs only.

*Primary Examiner*—Robert Kunemund
*Attorney, Agent, or Firm*—Cushman Darby & Cushman, L.L.P.

[57] ABSTRACT

The present invention relates to a diamond vibration plate for a speaker having high sound velocity or E/ρ and which is superior in high-pitched tone performance. Conventional diamond vibration plates which are made overall from crystalline diamond were apt to split or break at a flange due to the high rigidity. According to the present invention periphery of the flange is circularly cut by laser beams to eliminate rugged circumference. The laser treatment also converts the crystalline diamond of the flange into non-diamond carbon. The resulting vibration plate with a central spherical part of crystalline diamond and a periphery of a flange of non-diamond carbon excels both in high frequency property and mechanical strength.

12 Claims, 8 Drawing Sheets

VIBRATION PLATE OF A SPEAKER AND METHOD FOR PRODUCING SAME

This is a division of application Ser. No. 08/091,689, filed Jul. 15, 1993, now U.S. Pat. No. 5,430,004.

FIELD OF THE INVENTION

This invention relates to a vibrating plate of a speaker which excels in acoustic performance especially in high frequency region of sound.

BACKGROUND OF THE INVENTION

This application claims the priority of Japanese Patent Applications No. 212253/1992 filed Jul. 15, 1992 which is incorporated herein by reference.

An audio apparatus, e.g. stereo, radio, TV or CD player makes use of an assembly consisting of different speakers, e.g. low frequency speaker (woofer), middle frequency speaker (squawker) and high frequency speaker (tweeter) to generate sound. A speaker which converts electric power into sound energy comprises an electromechanical converter and a vibration plate which converts the mechanical vibration into sound waves. The vibration plate of a speaker was used to be made of paper. Materials of the vibration plate have been developed from paper to metal, e.g. titanium (Ti). The sound velocity on the material is one of important factors which determine the performance of vibration plate. The sound velocity is determined by the quotient $E/\rho$, where E is the Young's modulus and $\rho$ is the density of the material. The higher the sound velocity is, the more excellent the performance of the vibration plate for high frequency region becomes.

Beryllium (Be) has been known as a material endowed with high $E/\rho$. Speakers having beryllium vibration plates have already been produced for improving the response of speakers in high frequency region. However, beryllium is a poison. We want to avoid the use of beryllium vibrating plate from the view points of human health and environmental pollution.

Diamond is the material which is favored with the highest $E/\rho$. Since diamond has the highest sound velocity in all materials, the diamond vibration plate would be the most excellent for high frequency region. However, nobody succeeded in making a diamond vibration plate for a speaker, although the skilled would know the excellency of diamond for a vibration plate.

Many proposals have been done with respect to diamond speaker vibration plates. Japanese Patent Laying Open No. 61-128700 (128700/'86) defined the relation between the Young's modulus and the density of materials. Japanese Patent Laying Open No. 1-100277 (100277/'89) proposed a speaker vibration plate made from hard, carbon film. The proposed vibration plate was not diamond but a hard carbon film which has also a high $E/\rho$.

Japanese Patent Laying Open No. 62-152299 disclosed a method for making a diamond-like carbon film as a vibration plate, wherein the vibration plate is produced by depositing a diamond-like film on a substrate by the ion plating method and by eliminating the substrate by solving it. Japanese Patent Publication No. 55-33237 (33237/'80) manufactured a quasi-diamond carbon film as a speaker vibration plate by the ion beam evaporation method. Japanese Patent Publication No. 4-23480 (23480/'92) disclosed a method of making a vibration plate of a speaker, wherein the vibration plate is produced by depositing a diamond film on a dome-shaped silicon substrate by the CVD method and by eliminating the silicon substrate by solving with some etchant.

Diamond is sure to be the most preferable material for a vibration plate from the standpoint of large $E/\rho$ or large sound velocity. Many persons have proposed various diamond vibration plates of speakers so far.

Every prior proposal of diamond vibration plates lacks sufficient consideration to a singular shaped vibration plate. Hence, a speaker vibration plate is not a flat plate but a dome-shaped plate with a half-spherical part (A) and an external, circular flange (C) as shown in FIG. 1 or FIG. 11. The central spherical part and the annular flange have different roles and different inner stresses, and suffer different external forces. Especially, the periphery of the flange is apt to receive strong external stress. Every prior vibration plate had a central half-sphere and a circular flange made from the same material. The uniformity of material was a common feature of almost all conventional vibration plates. The central spherical part which is not fixed to anything vibrates in high frequency for converting mechanical vibration into sound vibration. Thus, the central part requires a high sound velocity for improving the high frequency performance. On the contrary, the periphery of the flange is fixed to something such as a peripheral metal part of a speaker equipped in a radio headphones or TV set. Since the flange which supports the central part is fixed to something, it cannot always deform freely. An external force certainly acts on the flange, because the flange contacts with some external parts. Larger inner stress remains in the flange rather than in the half-sphere. Therefore, high toughness is also important for the vibration plate of a speaker especially for the circular flange.

The conventional materials for vibration plates, e.g. paper, titanium (Ti) or beryllium (Be) indeed receive lower esteem than diamond, because they have lower Young's modulus or lower rigidity than diamond. However, the conventional materials enjoy high toughness. The vibration plates made from paper, titanium or beryllium are unlikely to break or split in spite of the repetitions of vibrations or external shocks. These materials have been established as materials for vibration plates. But diamond has not reached the practically-established material for vibration plates. Indeed, $E/\rho$ of diamond is very high, but high E means high rigidity. The highness of rigidity is apt to lower the toughness in many cases. In the case of diamond vibration plates, the high rigidity should induce breaks or splits of the plates. Weak resistance of diamond against repetitions of vibrations or external shocks has hindered diamond from being a material of vibration plates of speakers. Diamond vibration plates have never been practically used in audio apparatuses in spite of many proposals. The rigidity of diamond also invites a difficulty of production. When a diamond film is deposited on a substrate by a CVD method and the substrate is eliminated by acid, the diamond film is apt to break in the solution, because the diamond film misses the substrate as a supporter and inner large stress acts on splitting the film. Thus, the production of diamond vibration plates has not been put to practical use.

One purpose of this invention is to provide a tough diamond vibration plate which is immune from breaks or splits. Second purpose of this invention is to provide a method for producing a diamond vibration plate with high yield. Third purpose of this invention is to provide a diamond vibration plate which is cheaper than the prior diamond vibration plates.

SUMMARY OF THE INVENTION

A vibration plate of a speaker of this invention comprises a half-spherical part made from crystalline diamond and a circular flange including non-diamond carbon. Non-diamond carbon means the mixture of graphite and amorphous (glassy) carbon. The whole of the vibration plate is made once from crystalline diamond and then the periphery of the flange is cut by laser beams in a circle. The periphery of the flange is eliminated. A purpose of the laser cutting is removal of ragged parts of the periphery. The other purpose of the laser cutting is to heighten the toughness of the flange by forming a transformation layer. The irradiation of laser beams converts the crystalline diamond into graphite or glassy carbon. Namely, the local heating of laser beams around the flange circumference can convert the crystalline diamond into non-diamond carbon. Parts of the diamond in the flange near the locus of beams are transformed into graphite or amorphous carbon by the local heating of laser beams. The parts having the non-diamond carbon is referred to as a transformation layer. The transformation lowers the rigidity but enhances the toughness of the flange. The increase of toughness of the flange can effectively protect the vibration plate from being split or broken, because external forces mainly act on the circular flange. On the contrary, the decrease of rigidity of the flange can scarcely have a bad influence on the high frequency performance of the vibration plate, because the circular flange need not vibrate so violently. Namely, the decrease of rigidity of the flange heightens the resistance against breaks or splits without impairing the high frequency property.

This invention proposes a method for making a vibration plate comprising the steps of depositing diamond on a substrate body, irradiating laser beams circularly on a circular flange part for cutting the periphery of the flange and converting crystalline diamond of the flange into amorphous diamond, and solving and eliminating the substrate body. The posterior cutting treatment by the laser beams enhances the toughness and lowers the inner stress of the outer flange as well as eliminates the ragged part. The resistance of the flange against the external shock is heightened by the transformation layer. The reinforced flange can decrease the probability of the occurrence of splits or breaks of the flange in the production processes. Immunity from splits or breaks can heighten the yield. The vibration plate has a long life because of the high resistance against the external force of the flange part. Since the half-spherical part is made from crystalline diamond, the sound velocity on the spherical part is very high, which ensures the excellent high frequency property.

DETAILED DESCRIPTION OF PREFERRED EMBODIMENTS

[EMBODIMENT 1]

Figure 1:
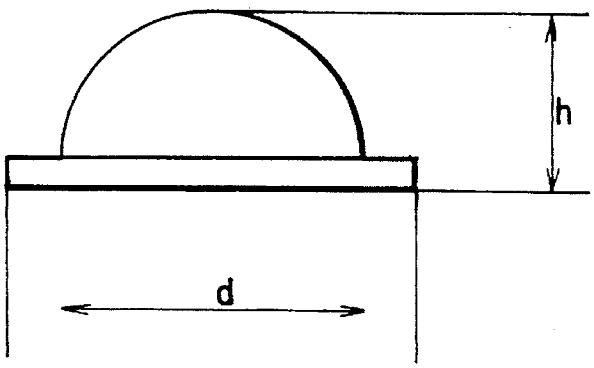
FIG. 1 is a front view of a vibration plate of a speaker.
Figure 2:
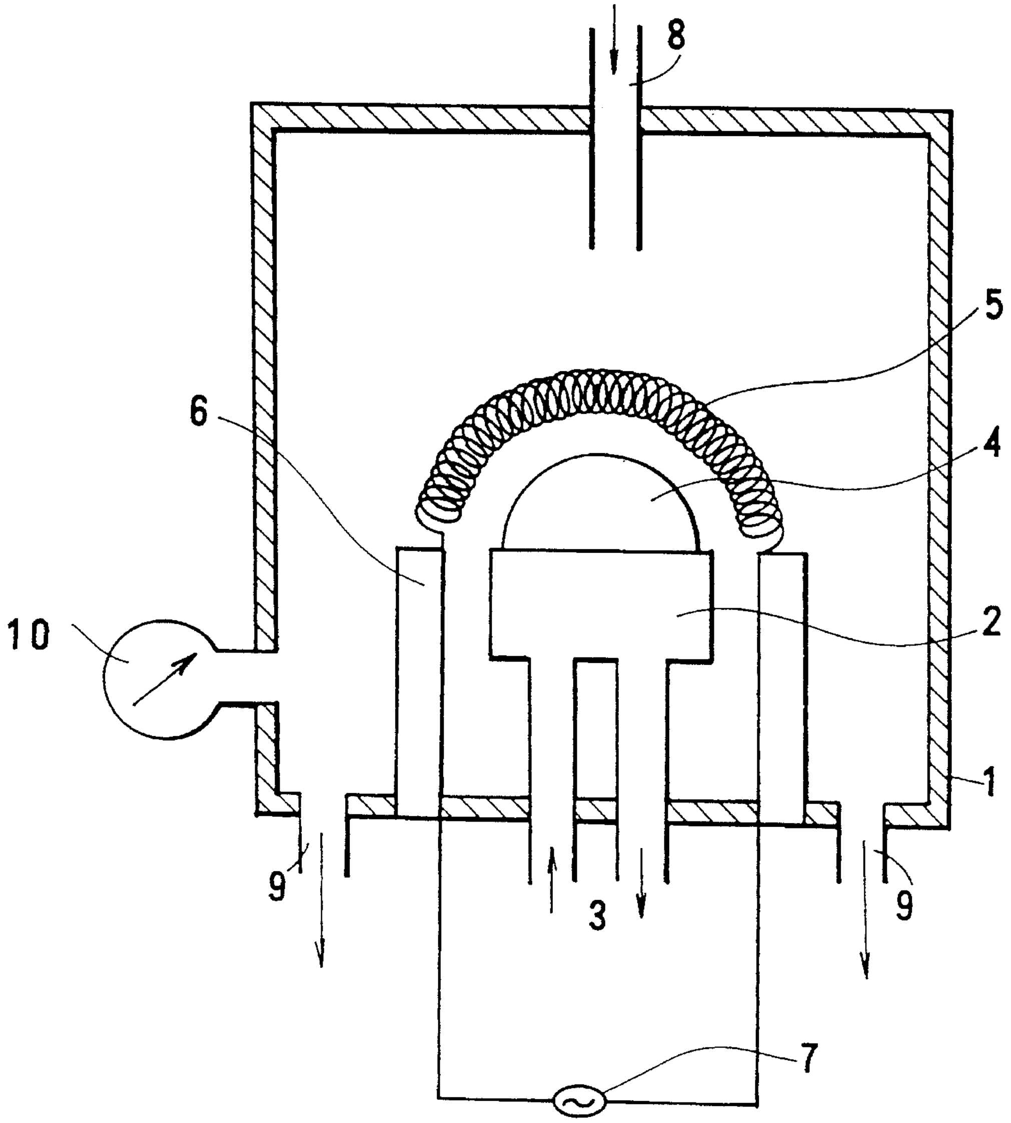
FIG. 2 is a schematic view of a filament CVD apparatus for forming a diamond film on a silicon substrate body.

A polycrystalline silicon block was shaped into a dome-like substrate-body for a vibration plate of speaker by a cutting process as shown in FIG. 1. The height of the substrate body was 7 mm. The silicon block was processed to a substrate body. The substrate body had a central half-spherical part and a peripheral, circular flange. A diamond film was deposited on the Si substrate body by the filament CVD method as shown in FIG. 2. The thickness of the grown diamond was 30 $\mu$ m. The diamond film was crystalline diamond. The film had also a central half-spherical part and a circular flange part.

In FIG. 2, a vacuum chamber (1) is a closed space which can be formed vacuous. The vacuum chamber (1) is equipped with a cooling susceptor (2) therein. Cooling water (3) is circulating in the cooling susceptor (2) for cooling the susceptor (2). A silicon substrate (4) lies on the cooling susceptor (2). A filament (5) is installed above the substrate body (4) for heating the substrate body (4). Both ends of the filament (5) are upheld by electrodes (6). A power source (7) connected to the electrodes supplies electric current to the filament (5). The vacuum chamber (1) is provided with a gas inlet (8) and gas outlets (9). Material gas is introduced into the vacuum chamber (1) through the gas inlet (8). The material gas includes hydrogen gas and carbon-containing gas. The material gas is heated by the heater filament (5). The gas molecules are excited to be an active state. Diamond is produced by the vapor phase reaction of the material gas induced by heating. A diamond film is gradually being deposited on the silicon substrate body (4). Exhaust gas is discharged through the gas outlets (9). A pressure gauge (10) monitors the pressure in the vacuum chamber (1).

Figure 3:
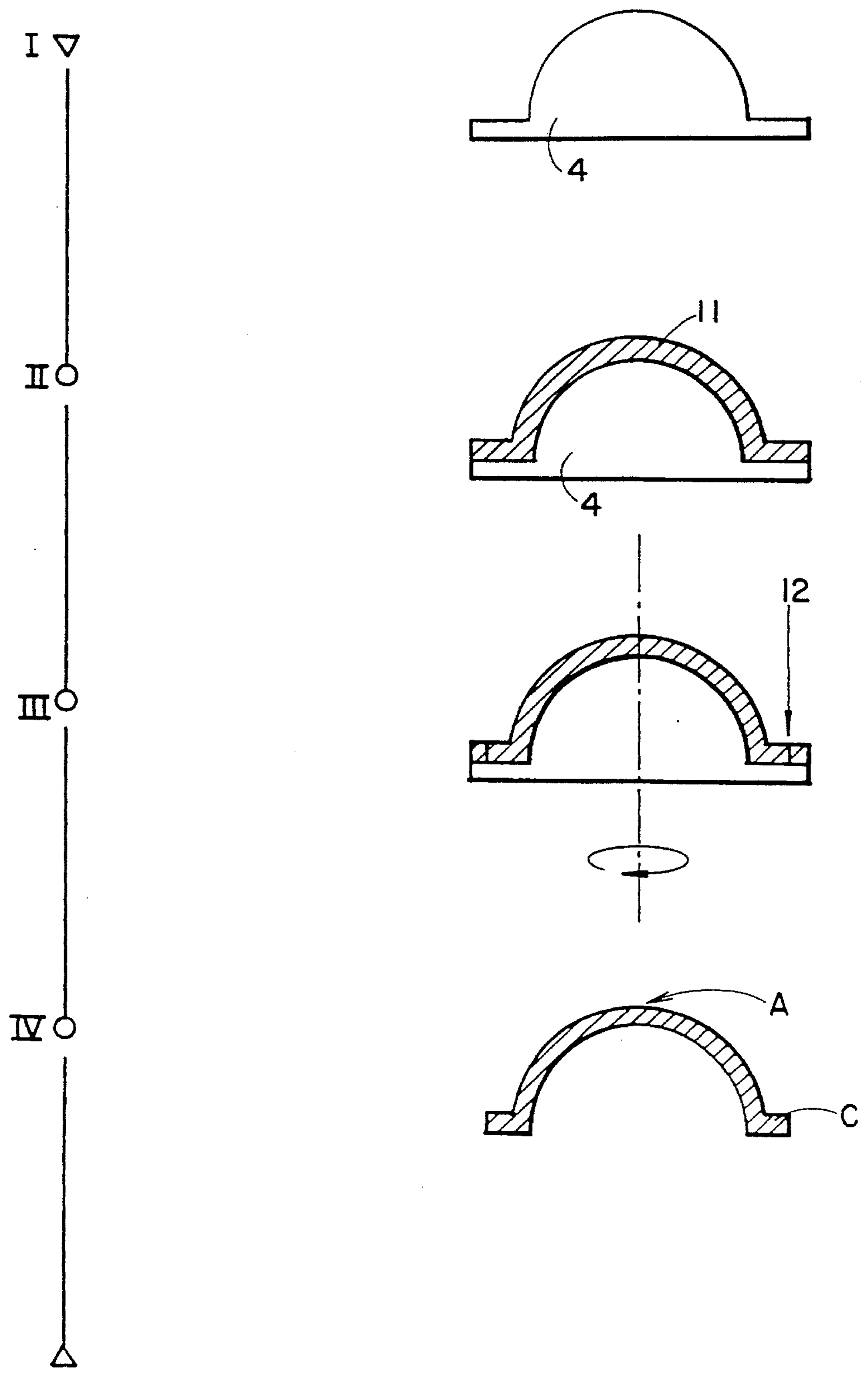
FIG. 3 is figures of the steps for making a speaker vibration plate according to this invention.

FIG. 3 shows the steps of producing a vibration plate according to this invention. The first line shows the first step of the preparation of a substrate body of silicon. A silicon block was shaped into a dome consisting of a central half-spherical part and a circular flange part by cutting. A diamond film was deposited on the prepared silicon substrate body by the CVD apparatus shown in FIG. 2. The second process was the coating of the substrate body with diamond, as shown in FIG. 3. The conditions for fabricating diamond were:

| | |
|---|---|
| Hydrogen gas | 1000 cc/min |
| Methane gas | 20 cc/min |
| Filament | tungsten (W) |
| Filament temperature | 2100° C. |
| Pressure | 60 Torr |
| Thickness of diamond film | 30 μm |

The silicon substrate body was coated with a diamond film to the thickness of approximately 30 μm in the filament CVD process. According to our experiment, favorable range of the thickness of the vibration plate was about 10 μm to about 70 μm. Preferable range of the thickness of the vibration plate was about 20 μm to about 50 μm. The substrate body coated with a diamond film was taken out from the vacuum chamber (1). The film covering the substrate body was crystalline diamond. Then YAG laser beams shot the circular flange for making a circular groove therearound for cutting the periphery with ruggedness. The grooving by laser beams converted the crystalline diamond into non-diamond carbon which contained amorphous carbon (glassy carbon) and graphite. The non-diamond carbon is inferior to crystalline diamond in rigidity, but is superior to crystalline diamond in toughness. The material of the half-spherical part was still crystalline diamond. Then, the substrate with the diamond film was thrown into a special etchant which could solve only silicon without solving diamond. The substrate body was solved and eliminated from the film. The periphery of the flange was also removed from the rest of the diamond film. The etchant was, e.g. a mixture of fluoric acid and nitric acid the ratio of which is 1:1. Consequently, a vibration plate for a speaker was obtained, as shown at the bottom of FIG. 3. The vibration plate had a central half-spherical part made from crystalline diamond and a periphery of the flange made from non-diamond carbon.

The Raman scattering spectra were measured for investigating the difference of materials between the central spherical part A and the periphery of the flange C.

Figure 4:
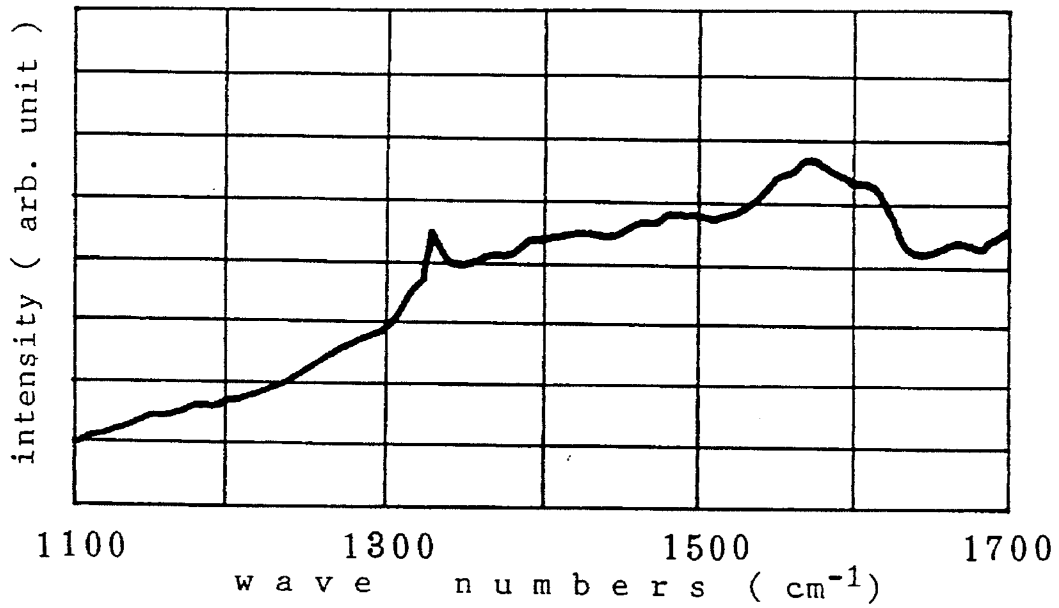
FIG. 4 is the Raman scattering spectrum of the circular flange C of the vibration plate of this invention.

FIG. 4 is the Raman scattering spectrum of the flange part C of the embodiment. The abscissa is the shift of wavenumbers from the incident light to the Raman scattering light. The ordinate is the intensity of the Raman scattering light (arbitrary unit). The peak wavenumber of Raman scattering shift for crystalline diamond is about 1333 $cm^{-1}$. The Raman spectrum of the flange C of the embodiment had a weak 1333 $cm^{-1}$ peak. The intensity between 1500 $cm^{-1}$ and 1600 $cm^{-1}$ was still higher than the 1332.5 $cm^{-1}$ peak. The broad spectrum between 1500 $cm^{-1}$ and 1600 $cm^{-1}$ corresponded to the Raman shift of non-diamond carbon ingredients, e.g. graphite or amorphous carbon. The Raman spectrum of FIG. 4 meant that the flange had little crystalline diamond. The main content of the flange part C is graphite and glassy carbon.

Figure 5:
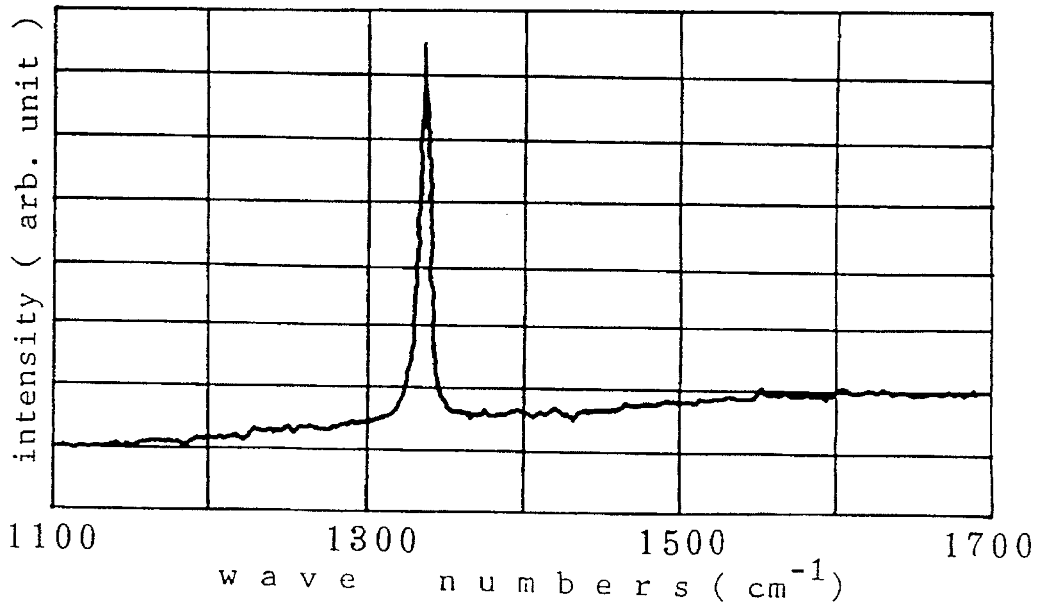
FIG. 5 is the Raman scattering spectrum of the half-sphere A of the vibration plate of this invention.

FIG. 5 is the Raman scattering spectrum of the spherical part A. The scattering spectrum had a sharp peak at the wavenumber of 1333 $cm^{-1}$, which corresponds to crystalline diamond. The other part of the spectrum was very low. The spectrum meant that the spherical part A is made of crystalline diamond of high quality. The results of Raman scattering measurements shown in FIG. 4 and FIG. 5 clearly show the two-fold structure of the vibration plate of this invention; central sphere of crystalline diamond and circular flange of non-diamond carbon. The flange is superior in toughness and the sphere part excels in $E/\rho$. The complementary property of flange and half-sphere is the most important feature of the vibration plate of this invention.

The highest resonance frequency of the vibration plate of the embodiment is about 80,000 Hz. A titanium (Ti) vibration plate of the same size and the same shape was made for comparing the performance of high-pitched tone. The Beryllium (Be) vibration plate shows the highest resonance frequency of about 28,000 Hz. Furthermore, an alumina ($Al_2O_3$) vibration plate of the same size and the same shape was made for comparing the high frequency property. 35,000 Hz is the highest resonance frequency for the alumina vibration plate. These results demonstrate that the diamond vibration plate of this invention is excellent in the high frequency region in comparison with the titanium or alumina vibration plate.

Figure 6:
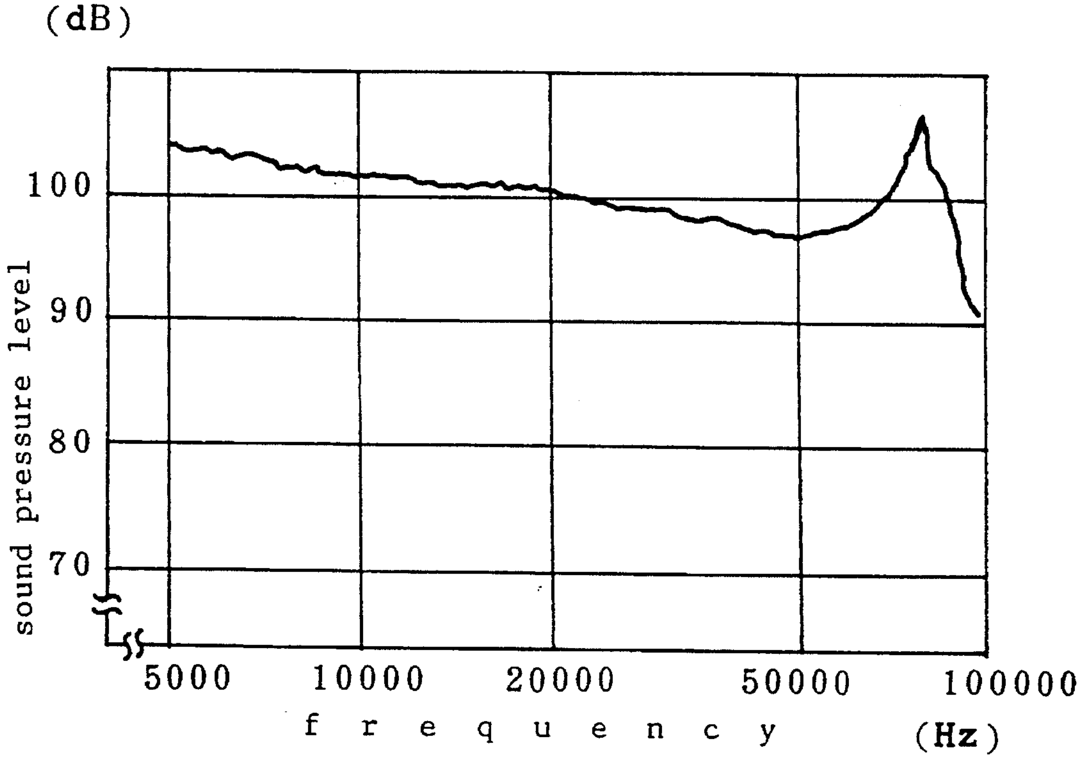
FIG. 6 is a graph showing the relation between the frequency and the sound pressure of the vibration plate of the embodiment.
Figure 7:
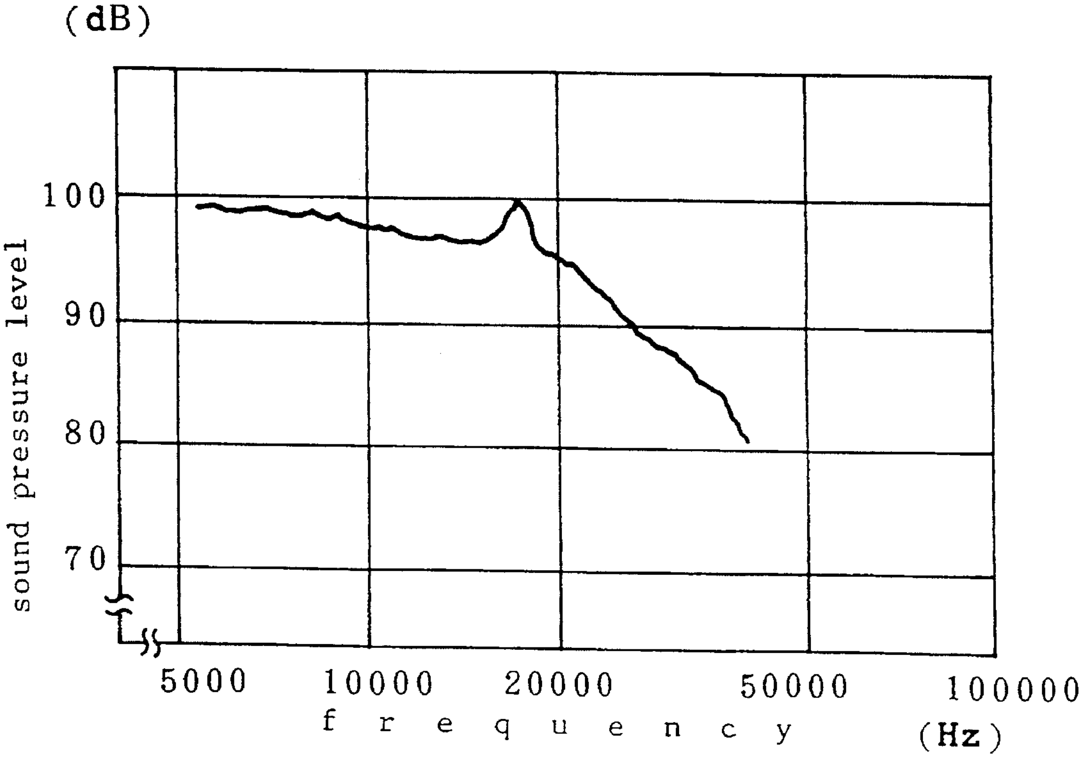
FIG. 7 is a graph showing the relation between the frequency and the sound pressure of the conventional vibration plate made from titanium.

The frequency-dependent property of the diamond vibration plate is surveyed. The result is shown in FIG. 6 which is a graph exhibiting the relation between the frequency and the sound pressure levels in the unit of dB. In order to compare the embodiment with a prior vibration plate in the frequency-dependent performance, the same property of a titanium vibration plate is measured. FIG. 7 is the result of the measurement of the titanium vibration plate. From the lower frequency region to about 20 kHz, the sound pressure level of the embodiment of two-fold diamond is about 4 dB higher than the pressure level of the titanium vibration plate overall. Beyond 20 kHz the difference of sound pressure levels is expanding in proportion to the deviation of the frequency from about 20 kHz. The titanium plate does not have sufficient sound levels over about 40 kHz. On the contrary, the two-fold diamond plate of the embodiment enjoys sufficient sound pressure levels up to about 100 kHz. The above measurements clarify the fact that the two-fold diamond plate of this invention is superior to the vibration plate made from other materials in the high-pitched tone property. Then the vibration plate of this invention will be compared to a full-diamond vibration plate having a half-sphere of crystalline diamond and a periphery of the flange of crystalline diamond.

[COMPARISON EXAMPLE (FULL DIAMOND VIBRATION PLATE)]

Figure 8:
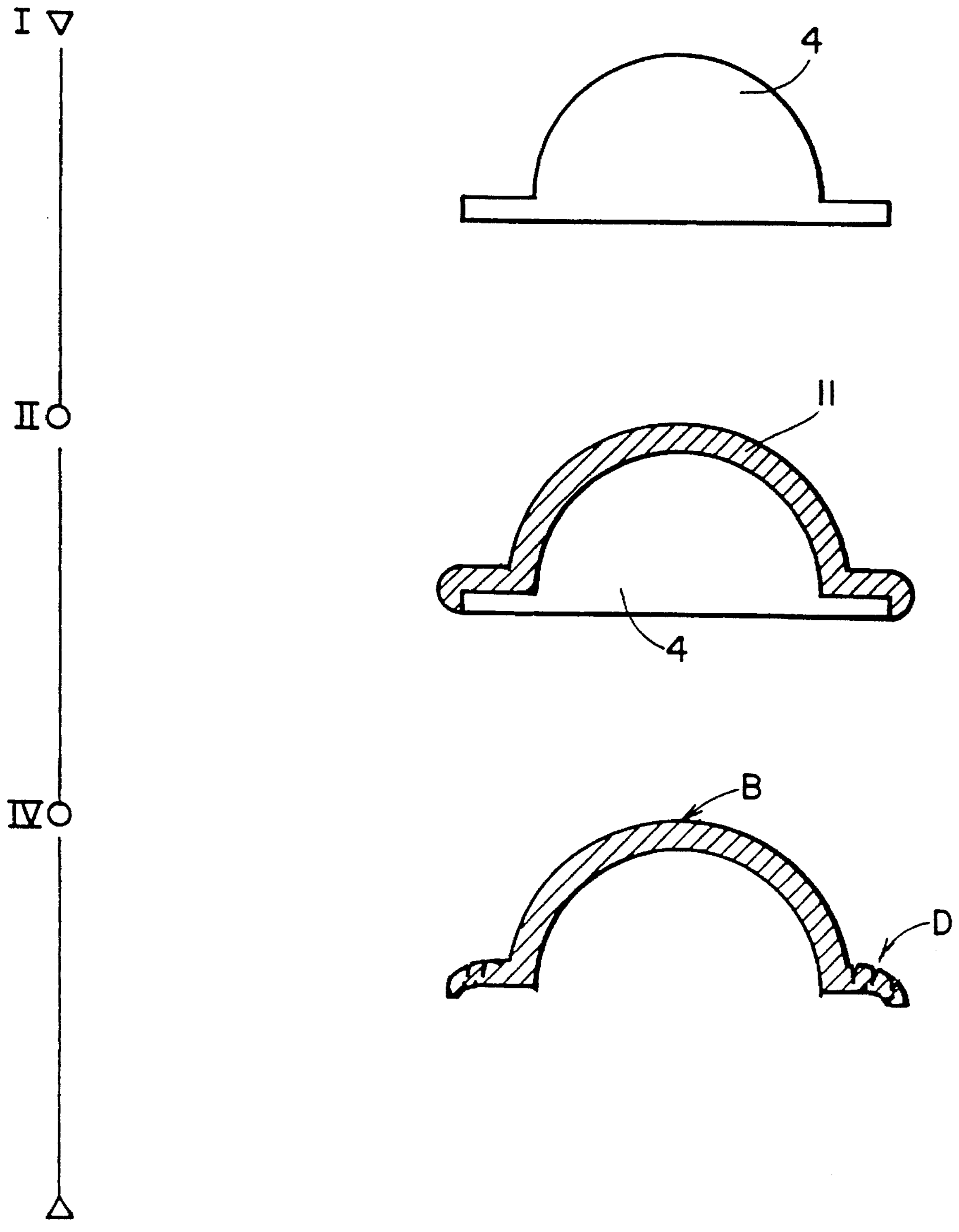
FIG. 8 is figures of the steps for making a speaker vibration plate of the comparison example without grooving process by a laser.

In order to confirm the excellency of the invention over a full-diamond plate, a uniform, diamond vibration plate was fabricated by the same method and the same conditions that had been practiced in the embodiment of this invention. The same apparatus shown in FIG. 2 was also used. The thickness of the diamond plate was 30 μm. The shape and size are the same as the embodiment's ones. The steps of production is shown by FIG. 8. The process lacks the step of circular grooving by laser beams. The diamond plate is not cut circularly at the flange by laser beams. The whole of the plate was made from crystalline diamond. Without the grooving step, the substrate was solved and eliminated by a pertinent etchant. But in the step of solution the substrate, peripheral parts of the flange were split or broken as soon as the flange loses the mechanical support of the substrate body. The vibration plate was not treated with the laser beam irradiation. Rugged parts accompanied the periphery of the flange. Furthermore, the flange made of crystalline diamond suffered a strong inner stress because of high rigidity. The split or break at the final stage of production was a failure of the uniform diamond plate. In order to confirm the uniform diamond structure, the Raman scattering spectra were measured at part B of the central half-sphere and at part D of the flange.

Figure 9:
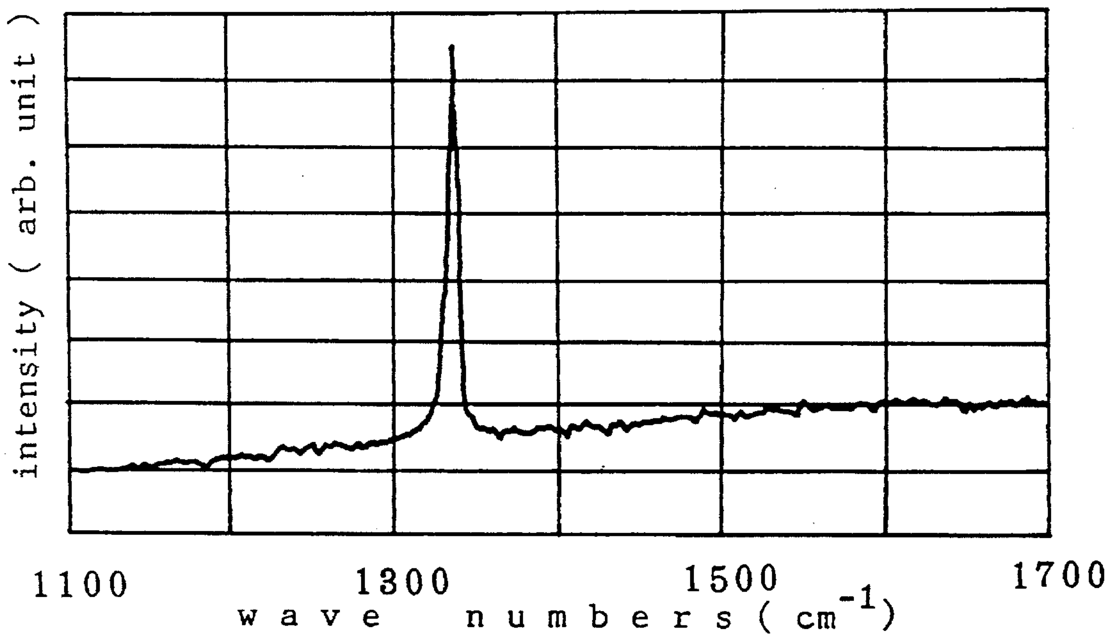
FIG. 9 is the Raman scattering spectrum of the half-sphere B of the vibration plate of the comparison example.

FIG. 9 is the Raman scattering spectrum of part B (half-sphere) of the comparison example. A 1832 μm peak outstandingly projected above other peaks. Other parts of the spectrum were low and nearly flat in the sphere part.

Figure 10:
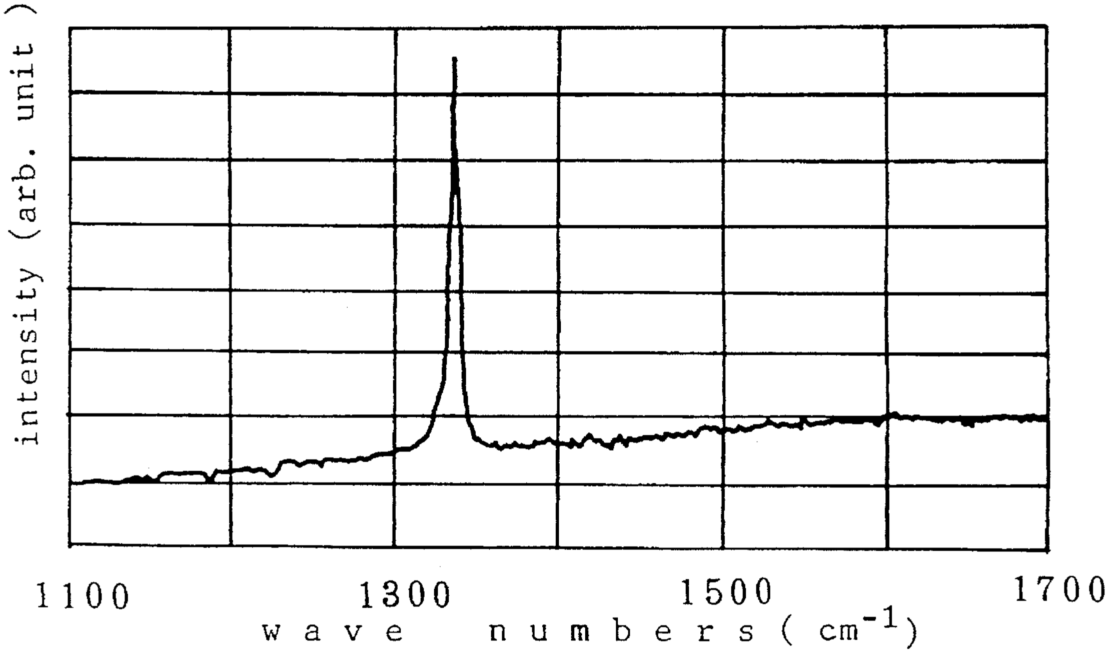
FIG. 10 is the Raman scattering spectrum of the circular flange part D of the vibration plate of the comparison example.

There was little non-diamond carbon ingredients in the sphere. This meant that part B of the comparison example is made from crystalline diamond. FIG. 10 is the Raman scattering spectrum of part D (flange) of the comparison example. The spectrum was nearly the same as that of the half-sphere part B. There was a high peak at the wavenumber of about 1333 $cm^{-1}$. Other parts were uniformly low. This meant that the flange part D included little non-diamond carbon ingredients and the whole of the flange was made from crystalline diamond. The comparison example was pure diamond with high quality. The outer flange was, however, apt to break or split in the production process or in the use, because the large inner stress remained in high quality diamond due to the excess rigidity. High rigidity cannot alleviate the inner stress or outer force. Consequently, the comparison example was easily broken in the production or in the use by the inner stress or external shock.

On the contrary, this invention lowers the rigidity of E/ρ of the periphery of the flange for ensuring a sufficient toughness by forming a transformation layer in the flange. The reinforced toughness of the flange can protect the flange from being broken or split in the step of solving the substrate body. The decrease of rigidity of the flange part ensures a long lifetime for the vibration plate of the invention. The decline of the rigidity at the flange does not impair the high frequency performance as shown in FIG. 6. The speaker vibration plate has a compromising, two-fold structure of diamond. The complementary property of the central spherical part and the periphery of the flange part enables to make a vibration plate endowed with excellent high frequency performance and a long life.

The meaning of the invention will be now explained again with reference to FIG. 11 to FIG. 16.

Figure 11:
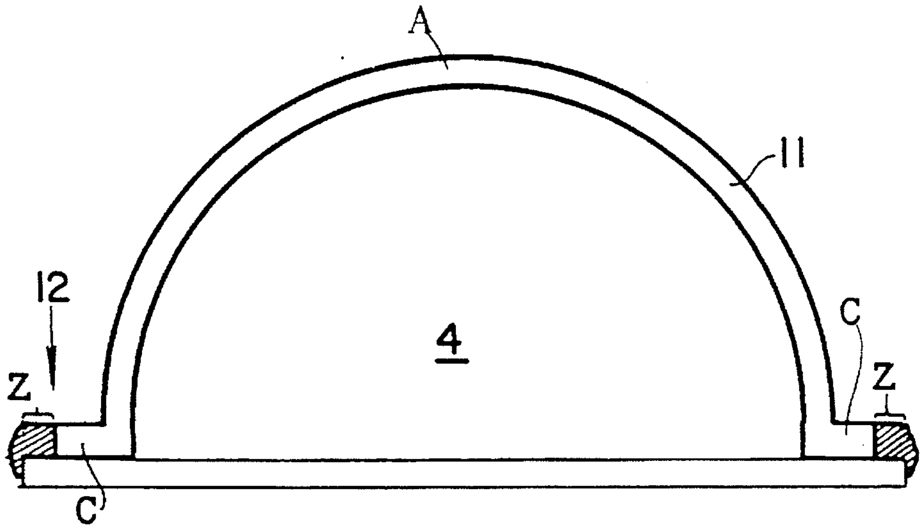
FIG. 11 is a sectional view of a dome-like deposited diamond film on a substrate.

FIG. 11 shows the section of a dome-shaped diamond film deposited on the silicon substrate.

A half-spherical part (A) and a flange (C) are made in a piece on the substrate. An outer part (Z) has a ragged circumference, because the circular edge of the substrate has perturbed the deposition of diamond in the CVD method. The rugged part (Z) must be removed, since a product of a vibration plate must not include such an ugly circumference (Z). Thus, the ragged circumference (Z) must be eliminated by some means in the process of production or after the process thereof. In this invention, (YAG) laser beams shear the rugged part (Z) of the flange (C) on the substrate in the process of production. As shown in FIG. 11 or FIG. 3, the laser beams depicts a circle on the flange (C). FIG. 3 demonstrates an example wherein the laser is fixed and the substrate body is rotated along a vertical center line. Of course, it is possible to let laser beams draw a circle on the fixed flange (C) by rotating or swaying mirrors.

Figure 12:
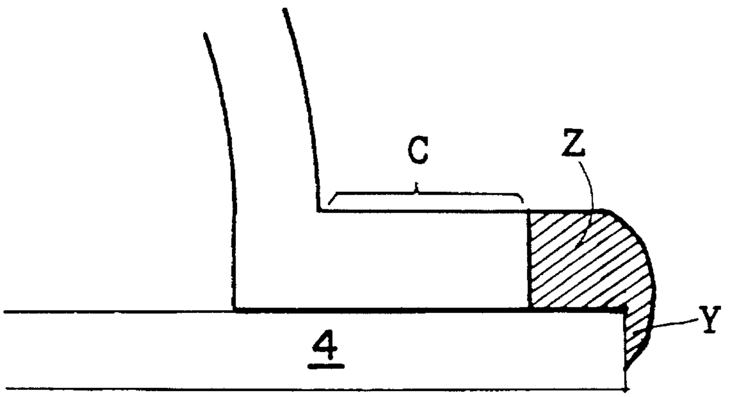
FIG. 12 is an enlarged view of the flange part of FIG. 11.

FIG. 12 is an enlarged view of the flange. Hatched part (Z) has a rugged surface (Y). A groove is bored till the upper surface of the substrate by laser beams between the hatched part (Z) and the blank (C). Although the rugged part (Z) is supported by the substrate, the rugged part (Z) has been already separated from the blank part (C) of the flange effectively by the groove. The circular groove has substantially divided the dome-shaped film into the rugged annular part (Z) and the rest. Then, the substrate with the film is thrown into an etchant for solving the Si substrate. The etchant, e.g. $HF:HNO_3=1:1$ solves and eliminates the substrate. The vanishment of the substrate liberates the rugged periphery (Z) from the rest of the film. The rugged periphery (Z) is removed. The flange loses the external annular part (Z). The width of the annular part (Z) is about 50 μm to about 2 mm, depending on the total width of the flange. The ugly, rugged surface (Z) has been eliminated by the laser beam shearing. New circumference of the flange (C) is a clearcut surface which has been formed by the laser beams.

Figure 13:
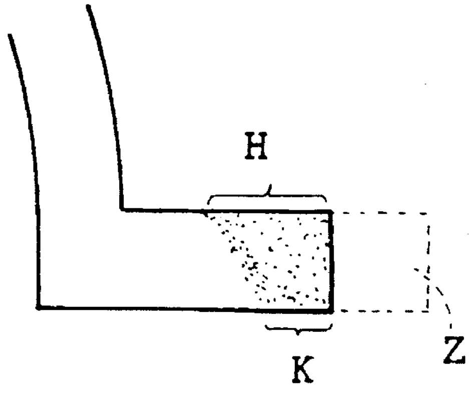
FIG. 13 is an enlarged view of the flange part after eliminating the annular part.
Figure 14:
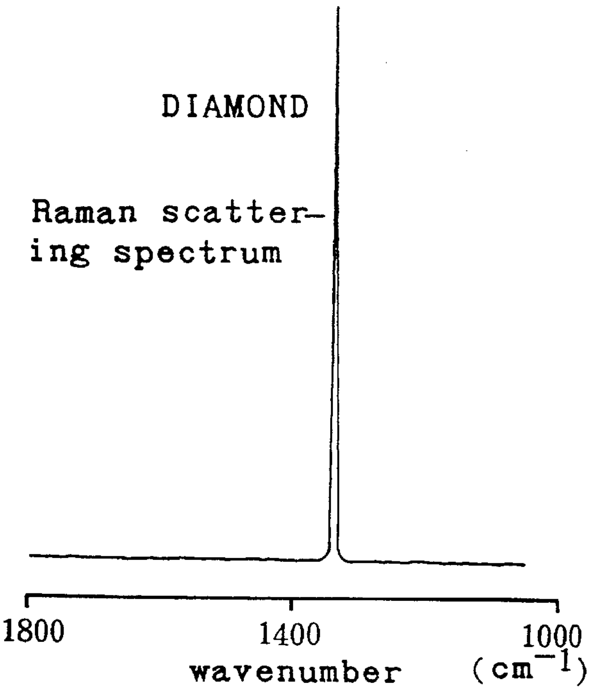
FIG. 14 is a Raman scattering spectrum of crystalline diamond.

What is more important is a formation of a transformation layer in the vicinity of the newly-sheared circumference. The heat of laser beams changes the crystallographical property of the material near the circumference. The dotted region in FIG. 13 is the transformation layer generated by the heat. The transformation layer includes non-diamond carbon, i.e. amorphous (glassy) carbon and crystalline carbon (e.g. graphite) instead of diamond. Non-diamond carbon is inferior to diamond in rigidity, but superior to diamond in toughness. The transformation region (H, K) reinforces the film by preventing the flange (C) from breaking or splitting in the process of production or in the use. The width of the transformation layer depends on the power of the laser beams. Since the beams shoot the flange on the upper side, the upper width (H) is in general larger than the lower width (K). For example, the upper width (H) is about 100 μm and the lower width (K) is about 50 μm. The width of the transformation layer can be enlarged till about 2 mm by strengthening the power of laser beams. The change of the transformation layer is visible. Eye-observation can recognize the appearance of the transformation layer.

Definitions of kinds of carbon are explained now. Diamond has a diamond crystalline structure of the $sp^3$ hybridization. The $sp^3$-hybridization means a structure in which a carbon atom has four equivalent nearest neighboring carbon atoms. The hybrid orbitals of $sp^3$ are generated by a S-wave function and three P-wave functions, namely $S+P_x+P_y-P_m$, $S+P_x-P_y+P_m$, $S-P_x+P_y+P_m$, and $S-P_x-P_y-P_m$. Four orbitals combine the central carbon atom to the four nearest neighboring carbon atoms.

FIG. 4 is a Raman scattering spectrum of diamond. The spectrum has a sharp peak at 1333 $cm^{-1}$ in wavenumber of the Raman shift.

Figure 16:
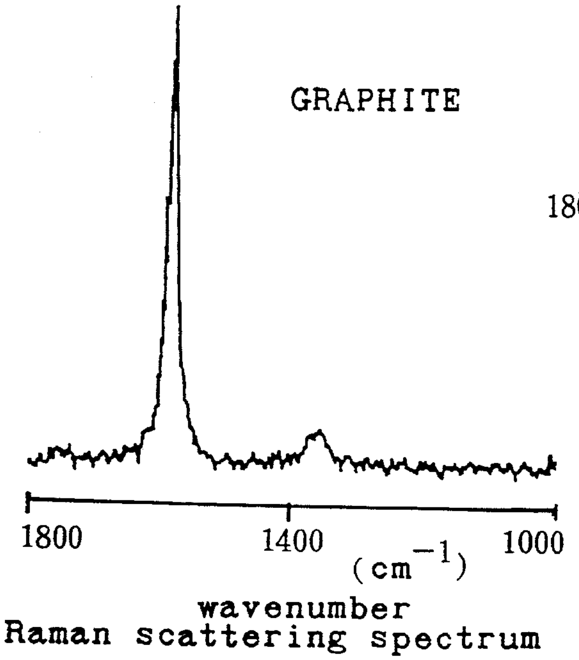
FIG. 16 is a Raman scattering spectrum of graphite.

Crystalline graphite is characterized by a $sp^2$-hybridization which is formed by a S-wave function and two P-wave functions. "Black lead" or "plumbago" is another name of graphite. Because of $sp^2$-hybridization, a carbon atom combines three nearest neighbor atoms with a double covalent bond. All connected carbon atoms lie on the same place. The $sp^2$-hybridization makes two dimensional structure of hexagon. The crystalline graphite is a conductor (diamond is an insulator). FIG. 16 is the Raman scattering spectrum of crystalline graphite. Graphite has a weak peak of about 1360 $cm^{-1}$ and a strong peak of about 1580 $cm^{-1}$ in the spectrum.

Figure 15:
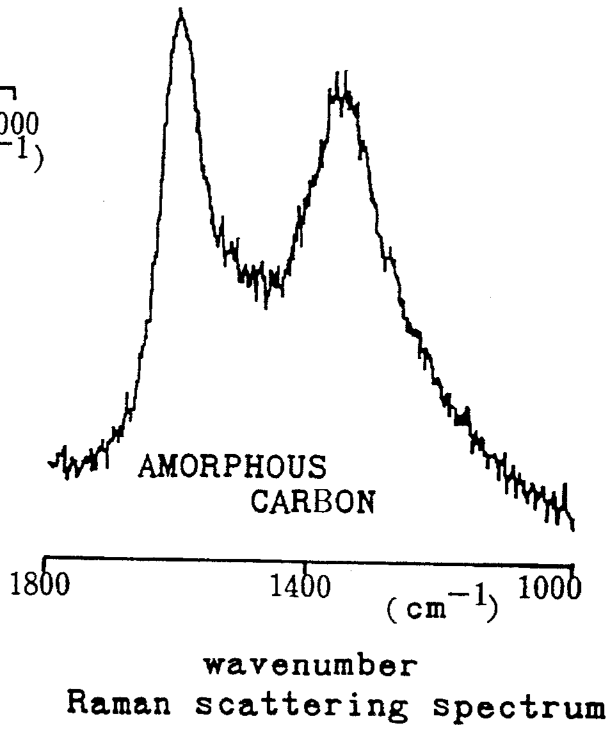
FIG. 15 is a Raman scattering spectrum of amorphous carbon.

Amorphous carbon (glassy carbon or vitreous carbon) has no crystallographic structure in a macroscopic scale. However, amorphous carbon has double bonds and $sp^2$-hybridization in a microscopic scale. FIG. 15 is the Raman scattering spectrum of amorphous carbon. Broad peaks appear between about 1400 $cm^{-1}$ and about 1600 $cm^{-1}$ in the Raman shift wavenumber. In addition to the Raman scattering spectrometry, X-ray diffraction analysis can be applied to identify the kinds of carbon ingredients.

What we claim is:

1. A method of producing a vibration plate of a speaker comprising the steps of:

providing a substrate body having a central part and an outer flange, introducing the substrate into a vacuum chamber, heating the substrate body, supplying a material gas including carbon and hydrogen to the vacuum chamber, depositing crystalline diamond on the substrate body by a CVD method to form a central part and an outer flange of the vibration plate, and irradiating a periphery of the flange of the vibration plate with at least one laser beam so that at least a portion of the flange is converted to non-diamond carbon while the central part is maintained as crystalline diamond.

2. A method according to claim 1, further comprising the steps of cooling the substrate body with diamond and removing the substrate body from the chamber.

3. A method according to claim 1, further comprising the step of dissolving and eliminating the substrate body.

4. A method according to claim 1, wherein said step of irradiating is conducted to cut the periphery of the outer flange.

5. A method according to claim 2, further comprising the step of dissolving and eliminating the substrate body.

6. A method according to claim 5, wherein said step of irradiating is conducted to cut the periphery of the outer flange.

7. A method of producing a vibration plate of a speaker comprising the steps of:

providing a substrate body having a half-spherical central part and a circular flange, introducing the substrate into a vacuum chamber, heating the substrate body, supplying a material gas including carbon and hydrogen to the vacuum chamber, depositing crystalline diamond on the substrate body by a CVD method to form a central half-spherical part and a circular flange of the vibration plate, and irradiating a periphery of the circular flange of the vibration plate with at least one laser beam so that at least a portion of the flange is converted to non-diamond carbon while the central half-spherical part is maintained as crystalline diamond.

8. A method according to claim 7, further comprising the steps of cooling the substrate body with diamond and removing the substrate body from the chamber.

9. A method according to claim 7, further comprising the step of dissolving and eliminating the substrate body.

10. A method according to claim 7, wherein said step of irradiating is conducted to cut the periphery of the circular flange.

11. A method according to claim 8, further comprising the step of dissolving and eliminating the substrate body.

12. A method according to claim 11, wherein said step of irradiating is conducted to cut the periphery of the circular flange.

* * * * *